US009422443B2

(12) United States Patent
Iguchi et al.

(10) Patent No.: US 9,422,443 B2
(45) Date of Patent: *Aug. 23, 2016

(54) METHOD FOR MANUFACTURING SILVER NANOPARTICLE-CONTAINING INK, AND SILVER NANOPARTICLE-CONTAINING INK

(71) Applicant: DAICEL CORPORATION, Osaka-shi, Osaka (JP)

(72) Inventors: Yuki Iguchi, Himeji (JP); Kazuki Okamoto, Himeji (JP)

(73) Assignee: DAICEL CORPORATION, Osaka-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/418,816

(22) PCT Filed: Jul. 29, 2013

(86) PCT No.: PCT/JP2013/070498
§ 371 (c)(1),
(2) Date: Jan. 30, 2015

(87) PCT Pub. No.: WO2014/021270
PCT Pub. Date: Feb. 6, 2014

(65) Prior Publication Data
US 2015/0225588 A1    Aug. 13, 2015

(30) Foreign Application Priority Data

Aug. 2, 2012  (JP) .................................. 2012-171882

(51) Int. Cl.
| | |
|---|---|
| C09D 11/52 | (2014.01) |
| H01B 1/22 | (2006.01) |
| H05K 1/09 | (2006.01) |
| B82Y 30/00 | (2011.01) |
| B82Y 40/00 | (2011.01) |
| B22F 9/30 | (2006.01) |
| B22F 9/24 | (2006.01) |
| C09D 11/322 | (2014.01) |
| C09D 11/36 | (2014.01) |
| C08K 3/08 | (2006.01) |
| B22F 1/00 | (2006.01) |

(52) U.S. Cl.
CPC ............. *C09D 11/52* (2013.01); *B22F 1/0022* (2013.01); *B22F 9/24* (2013.01); *B22F 9/30* (2013.01); *B82Y 30/00* (2013.01); *C08K 3/08* (2013.01); *C09D 11/322* (2013.01); *C09D 11/36* (2013.01); *H01B 1/22* (2013.01); *H05K 1/097* (2013.01); *B82Y 40/00* (2013.01); *C08K 2003/0806* (2013.01)

(58) Field of Classification Search
CPC ........ C09D 11/52; H01B 1/22; H05K 1/097; B82Y 30/00; B82Y 40/00
USPC ....................................... 106/31.92; 252/514
See application file for complete search history.

(56) References Cited

U.S. PATENT DOCUMENTS

| | | | | |
|---|---|---|---|---|
| 7,270,694 B2 * | 9/2007 | Li | ............................ | H01B 1/22 75/351 |
| 8,361,350 B2 | 1/2013 | Wu et al. | | |
| 2008/0124238 A1 * | 5/2008 | Atsuki | ................... | H05K 1/097 419/10 |
| 2009/0031856 A1 * | 2/2009 | Lee | ........................... | B22F 9/24 75/343 |
| 2009/0078915 A1 | 3/2009 | Lee et al. | | |
| 2010/0143591 A1 | 6/2010 | Wu et al. | | |
| 2010/0189901 A1 | 7/2010 | Chung et al. | | |
| 2012/0043510 A1 | 2/2012 | Kurihara et al. | | |
| 2013/0334470 A1 | 12/2013 | Kurihara et al. | | |
| 2014/0346412 A1 | 11/2014 | Okamoto et al. | | |
| 2014/0374670 A1 * | 12/2014 | Mokhtari | ................. | H01B 1/22 252/514 |
| 2015/0001452 A1 | 1/2015 | Kurihara et al. | | |
| 2015/0217375 A1 * | 8/2015 | Iguchi | .................... | H01B 13/00 420/501 |
| 2015/0224578 A1 * | 8/2015 | Okamoto | ................ | H01B 1/22 252/514 |

FOREIGN PATENT DOCUMENTS

| | | |
|---|---|---|
| CN | 101747678 A | 6/2010 |
| CN | 102395439 A | 3/2012 |

(Continued)

OTHER PUBLICATIONS

International Search Report, issued in PCT/JP2013/070498, dated Aug. 27, 2013.
Written Opinion of the International Searching Authority, issued in PCT/JP2013/070498, dated Aug. 27, 2013.
International Preliminary Report on Patentability and Written Opinion of the International Searching Authority (Forms PCT/IB/338, PCT/IB/373, PCT/ISA/237 and PCT/IB/326), with English translation thereof, dated Feb. 12, 2015, for International Application No. PCT/JP2013/070498.

(Continued)

*Primary Examiner* — Helene Klemanski
(74) *Attorney, Agent, or Firm* — Birch, Stewart, Kolasch & Birch, LLP

(57) ABSTRACT

Silver nanoparticle-containing ink which develops excellent conductivity by low-temperature calcining and has silver nano-particles stably and well dispersed in a dispersion solvent. Method for producing the silver nanoparticle-containing ink, by: mixing a silver compound with amines comprising an aliphatic hydrocarbon monoamine (A) comprising one amino group and an aliphatic hydrocarbon group having 6 or more carbon atoms in total; and further comprising at least one of: an aliphatic hydrocarbon monoamine (B) comprising one amino group and an aliphatic hydrocarbon group having 5 or less carbon atoms in total; and an aliphatic hydrocarbon diamine (C) comprising two amino groups and an aliphatic hydrocarbon group having 8 or less carbon atoms in total; to form a complex compound comprising the silver compound and the amines; thermally decomposing the complex compound by heating to form silver nano-particles; and dispersing the silver nano-particles in a dispersion solvent containing an alicyclic hydrocarbon.

14 Claims, No Drawings

(56) References Cited

FOREIGN PATENT DOCUMENTS

| | | |
|---|---|---|
| EP | 2420336 A1 | 2/2012 |
| JP | 2008-72052 A | 3/2008 |
| JP | 2008-214695 A | 9/2008 |
| JP | 2009-215502 | 9/2009 |
| JP | 2010-265543 A | 11/2010 |
| JP | 2012-31439 A | 2/2012 |
| JP | 2013-142172 A | 7/2013 |
| JP | 2013-142173 A | 7/2013 |
| KR | 10-2007-0086915 A | 8/2007 |
| KR | 10-2008-0013787 A | 2/2008 |
| WO | 2012-52225 A | 3/2012 |
| WO | 2012-162767 A | 8/2012 |
| WO | WO 2012/105682 A1 | 8/2012 |
| WO | WO 2013/105530 A1 | 7/2013 |
| WO | WO 2013/105531 A1 | 7/2013 |
| WO | WO 2014/024721 A1 * | 2/2014 |
| WO | WO 2014/024901 A1 * | 2/2014 |

OTHER PUBLICATIONS

Extended European Search Report for European Appl. No. 13825854.6, dated Mar. 29, 2016.

* cited by examiner

METHOD FOR MANUFACTURING SILVER NANOPARTICLE-CONTAINING INK, AND SILVER NANOPARTICLE-CONTAINING INK

TECHNICAL FIELD

The present invention relates to a method for producing silver nanoparticle-containing ink and silver nanoparticle-containing ink. The present invention is applied also to a method for producing metal nanoparticle-containing ink containing a metal other than silver and said metal nanoparticle-containing ink.

BACKGROUND ART

Silver nano-particles can be sintered even at a low temperature. Utilizing this property, a silver coating composition containing silver nano-particles is used to form electrodes or conductive circuit patterns on a substrate in production of various electronic devices. Silver nano-particles are usually dispersed in an organic solvent. Silver nano-particles have an average primary particle diameter of about several nanometers to about several tens of nanometers, and their surfaces are usually coated with an organic stabilizer (protective agent). When the substrate is a plastic film or sheet, silver nano-particles need to be sintered at a low temperature (e.g., at 200° C. or less) less than a heat resistant temperature of the plastic substrate.

Particularly, attempts have been recently made to form fine metal lines (e.g., silver lines) not only on heat-resistant polyimide substrates that are already in use as substrates for flexible printed circuit boards but also on substrates made of various plastics, such as PET (polyethylene terephthalate) and polypropylene, that have lower heat resistance than polyimide but can be easily processed and are cheap. When plastic substrates having low heat resistance are used, metal nano-particles (e.g., silver nano-particles) need to be sintered at a lower temperature.

For example, JP-A-2008-214695 discloses a method for producing silver ultrafine particles, comprising reacting silver oxalate and oleylamine to form a complex compound containing at least silver, oleylamine and an oxalate ion; and thermally decomposing the formed complex compound to form silver ultrafine particles (claim 1). Further, JP-A-2008-214695 discloses that in the above method, a saturated aliphatic amine having 1 to 18 carbon atoms in total is reacted in addition to the silver oxalate and the oleylamine (claims 2 and 3), so that a complex compound can be easily formed, the time required to produce silver ultrafine particles can be reduced, and the silver ultrafine particles protected by these amines can be formed in higher yield (paragraph [0011]).

JP-A-2010-265543 discloses a method for producing coated silver ultrafine particles, comprising the first step of mixing a silver compound that is decomposed by heating to generate metallic silver, a mid- to short-chain alkylamine having a boiling point of 100° C. to 250° C., and a mid- to short-chain alkyldiamine having a boiling point of 100° C. to 250° C. to prepare a complex compound containing the silver compound, the alkylamine and the alkyldiamine; and the second step of thermally decomposing the complex compound (claim 3, paragraphs [0061] and [0062]).

PRIOR ART DOCUMENTS

Patent Documents

Patent Document 1: JP-A-2008-214695
Patent Document 2: JP-A-2010-265543

SUMMARY OF THE INVENTION

Problems to be Solved by the Invention

Silver nano-particles have an average primary particle diameter of about several nanometers to about several tens of nanometers, and are more likely to agglomerate than micron (μm)-size particles. Therefore, the reduction reaction of a silver compound (thermal decomposition reaction in the above patent documents) is performed in the presence of an organic stabilizer (protective agent such as an aliphatic amine or an aliphatic carboxylic acid) so that the surfaces of resulting silver nano-particles are coated with the organic stabilizer.

Meanwhile, silver nano-particles are used in a silver coating composition (silver ink or silver paste) in which the particles are contained in an organic solvent. In order to development conductivity, an organic stabilizer coating the silver nano-particles needs to be removed during calcining performed after application of the silver coating composition onto a substrate to sinter the silver particles. When the temperature of the calcining is low, the organic stabilizer is poorly removed. When the silver particles are not sufficiently sintered, a low resistance value cannot be achieved. That is, the organic stabilizer present on the surfaces of the silver nano-particles contributes to the stabilization of the silver nano-particles, but on the other hand, interferes with the sintering of the silver nano-particles (especially, sintering by low-temperature calcining).

The use of an aliphatic amine compound and/or an aliphatic carboxylic acid compound each having a relatively long chain (e.g., 8 or more carbon atoms) as an organic stabilizer makes it easy to stabilize silver nano-particles because it is easy to ensure space between the silver nano-particles. On the other hand, the long-chain aliphatic amine compound and/or the long-chain aliphatic carboxylic acid compound are/is poorly removed when the temperature of calcining is low.

As described above, the relationship between the stabilization of silver nano-particles and the development of a low resistance value by low-temperature calcining is a trade-off.

As described above, in JP-A-2008-214695, oleylamine having 18 carbon atoms and a saturated aliphatic amine having 1 to 18 carbon atoms are used in combination as aliphatic amine compounds. However, the use of oleylamine as a main ingredient of a protective agent inhibits sintering of silver nano-particles during low-temperature calcining. Further, the reaction rate of forming a complex compound of oleylamine and silver oxalate is not satisfactory.

As described above, in JP-A-2010-265543, a mid- to short-chain alkylamine having a boiling point of 100° C. to 250° C. (paragraph [0061]) and a mid- to short-chain alkyldiamine having a boiling point of 100° C. to 250° C. (paragraph [0062]) are used in combination as aliphatic amine compounds. This method improves the problem resulting from the use of oleylamine as a main ingredient of a protective agent.

However, in JP-A-2010-265543, since the mid- to short-chain alkylamine and the mid- to short-chain alkyldiamine are used as a protective agent, dispersibility of resulting silver nano-particles in an organic solvent is lower than that when long-chain oleylamine is used as a main ingredient of a protective agent.

As described above, silver nanoparticle-containing ink has not been so far developed, which is capable of achieving sintering of silver nano-particles during low-temperature calcining and has silver nano-particles stably and well dispersed in an organic solvent.

Further, in view of ink-jet printing, silver nanoparticle-containing ink needs to be ink that causes no clogging of ink-jet heads.

It is therefore an object of the present invention is to provide silver nanoparticle-containing ink that develops excellent conductivity (low resistance value) by low-temperature calcining and has silver nano-particles stably and well dispersed in a dispersion solvent, and a method for producing the silver nanoparticle-containing ink. Particularly, it is an object of the present invention to provide silver nanoparticle-containing ink suitable for ink-jet applications and a method for producing the silver nanoparticle-containing ink.

Means for Solving the Problems

The present inventors have found that the above object can be achieved by dispersing, in a dispersion solvent containing an alicyclic hydrocarbon, silver nano-particles prepared by a so-called thermal decomposition method using aliphatic amine compounds having a relatively short carbon chain as a complex-forming agent and/or a protective agent.

The present invention includes the following aspects.

(1) A method for producing silver nanoparticle-containing ink, comprising:

mixing a silver compound with an amine mixture comprising an aliphatic hydrocarbon monoamine (A) comprising an aliphatic hydrocarbon group and one amino group, said aliphatic hydrocarbon group having 6 or more carbon atoms in total; and further comprising at least one of: an aliphatic hydrocarbon monoamine (B) comprising an aliphatic hydrocarbon group and one amino group, said aliphatic hydrocarbon group having 5 or less carbon atoms in total; and an aliphatic hydrocarbon diamine (C) comprising an aliphatic hydrocarbon group and two amino groups, said aliphatic hydrocarbon group having 8 or less carbon atoms in total; to form a complex compound comprising the silver compound and the amines;

thermally decomposing the complex compound by heating to form silver nano-particles; and dispersing the silver nano-particles in a dispersion solvent containing an alicyclic hydrocarbon.

(2) The method for producing silver nanoparticle-containing ink according to the above (1), wherein the silver compound is silver oxalate.

(3) The method for producing silver nanoparticle-containing ink according to the above (1) or (2), wherein the alicyclic hydrocarbon is a compound containing a six- to twelve-membered ring structure.

(4) The method for producing silver nanoparticle-containing ink according to any one of the above (1) to (3), wherein the alicyclic hydrocarbon is a compound containing a six-membered ring structure.

(5) The method for producing silver nanoparticle-containing ink according to any one of the above (1) to (4), wherein the alicyclic hydrocarbon is a compound having a monocyclic or polycyclic structure.

(6) The method for producing silver nanoparticle-containing ink according to any one of the above (1) to (5), wherein the alicyclic hydrocarbon is contained in the dispersion solvent in an amount of 10 to 90 wt %.

(7) The method for producing silver nanoparticle-containing ink according to any one of the above (1) to (6), wherein the dispersion solvent further contains an aliphatic alcohol having 4 or more carbon atoms.

(8) The method for producing silver nanoparticle-containing ink according to the above (7), wherein the aliphatic alcohol having 4 or more carbon atoms is contained in the dispersion solvent in an amount of 10 to 90 wt %.

The method for producing silver nanoparticle-containing ink according to any one of the above, wherein the amines comprise the aliphatic hydrocarbon monoamine (A) and the aliphatic hydrocarbon monoamine (B).

The method for producing silver nanoparticle-containing ink according to any one of the above, wherein the amines comprise the aliphatic hydrocarbon monoamine (A) and the aliphatic hydrocarbon diamine (C).

The method for producing silver nanoparticle-containing ink according to any one of the above, wherein the amines comprise the aliphatic hydrocarbon monoamine (A), the aliphatic hydrocarbon monoamine (B), and the aliphatic hydrocarbon diamine (C).

The method for producing silver nanoparticle-containing ink according to any one of the above, wherein in the step of forming a complex compound comprising the silver compound and the amines, an aliphatic carboxylic acid is also used in addition to the amines.

(9) The method for producing silver nanoparticle-containing ink according to any one of the above (1) to (8), wherein the aliphatic hydrocarbon monoamine (A) is an alkylmonoamine having 6 or more and 12 or less carbon atoms.

(10) The method for producing silver nanoparticle-containing ink according to any one of the above (1) to (9), wherein the aliphatic hydrocarbon monoamine (B) is an alkylmonoamine having 2 or more and 5 or less carbon atoms.

(11) The method for producing silver nanoparticle-containing ink according to any one of the above (1) to (10), wherein the aliphatic hydrocarbon diamine (C) is an alkylenediamine in which one of the two amino groups is a primary amino group, and the other is a tertiary amino group.

(12) The method for producing silver nanoparticle-containing ink according to any one of the above (1) to (11), wherein the aliphatic amines are used in an amount of 1 to 50 moles as a total of the monoamine (A), the monoamine (B) and the diamine (C) per 1 mole of silver atoms in the silver compound.

A molecule of silver oxalate contains two silver atoms. The method for producing silver nanoparticle-containing ink according to any one of the above (1) to (11), wherein when the silver compound is silver oxalate, the aliphatic amines are used in an amount of 2 to 100 moles as a total of the monoamine (A), the monoamine (B) and the diamine (C) per 1 mole of silver oxalate.

(13) The silver nanoparticle-containing ink comprising silver nano-particles and a dispersion solvent, which is produced by the method according to any one of the above (1) to (12).

(14) The silver nanoparticle-containing ink according to the above (13), wherein the silver nano-particles are contained in an amount of 25 wt % or more.

(15) Silver nanoparticle-containing ink comprising silver nano-particles and a dispersion solvent that disperses the silver nano-particles, wherein the silver nano-particles are formed by:

mixing a silver compound with amines comprising an aliphatic hydrocarbon monoamine (A) comprising an aliphatic hydrocarbon group and one amino group, said aliphatic hydrocarbon group having 6 or more carbon atoms in total; and further comprising at least one of: an aliphatic hydrocarbon monoamine (B) comprising an aliphatic hydrocarbon group and one amino group, said aliphatic hydrocarbon group having 5 or less carbon atoms in total; and an aliphatic hydrocarbon diamine (C) comprising an aliphatic hydrocarbon group and two amino groups, said aliphatic hydrocarbon group having 8 or less carbon atoms in total; to form a complex compound comprising the silver compound and the amines; and thermally decomposing the complex compound by heating; and wherein the dispersion solvent contains an alicyclic hydrocarbon.

The silver compound is preferably silver oxalate.

(16) Silver nanoparticle-containing ink comprising silver nano-particles whose surfaces are coated with a protective agent, and a dispersion solvent that disperses the silver nano-particles, wherein the protective agent comprises an aliphatic hydrocarbon monoamine (A) comprising an aliphatic hydrocarbon group and one amino group, said aliphatic hydrocarbon group having 6 or more carbon atoms in total; and further comprises at least one of: an aliphatic hydrocarbon monoamine (B) comprising an aliphatic hydrocarbon group and one amino group, said aliphatic hydrocarbon group having 5 or less carbon atoms in total; and an aliphatic hydrocarbon diamine (C) comprising an aliphatic hydrocarbon group and two amino groups, said aliphatic hydrocarbon group having 8 or less carbon atoms in total; and wherein the dispersion solvent contains an alicyclic hydrocarbon.

(17) The silver nanoparticle-containing ink according to the above (15) or (16), wherein the alicyclic hydrocarbon is a compound containing a six- to twelve-membered ring structure.

(18) The silver nanoparticle-containing ink according to any one of the above (15) to (17), wherein the alicyclic hydrocarbon is a compound containing a six-membered ring structure.

(19) The silver nanoparticle-containing ink according to any one of the above (15) to (18), wherein the alicyclic hydrocarbon is a compound having a monocyclic or polycyclic structure.

(20) The silver nanoparticle-containing ink according to any one of the above (15) to (19), wherein the alicyclic hydrocarbon is contained in the dispersion solvent in an amount of 10 to 90 wt %.

(21) The silver nanoparticle-containing ink according to any one of the above (15) to (20), wherein the dispersion solvent further contains an aliphatic alcohol having 4 or more carbon atoms.

(22) The silver nanoparticle-containing ink according to the above (21), wherein the aliphatic alcohol having 4 or more carbon atoms is contained in the dispersion solvent in an amount of 10 to 90 wt %.

(23) The silver nanoparticle-containing ink according to anyone of the above (15) to (21), wherein the aliphatic amines are contained in an amount of 1 to 50 moles as a total of the monoamine (A), the monoamine (B), and the diamine (C) per 1 mole of silver atoms in the silver nano-particles.

(24) The silver nanoparticle-containing ink according to any one of the above (15) to (22), wherein the silver nano-particles are contained in an amount of 25 wt % or more.

(25) The silver nanoparticle-containing ink according to any one of the above (13) to (24), which is used for ink-jet printing.

(26) A method for producing a silver conductive material, comprising:

applying, onto a substrate, silver nanoparticle-containing ink produced by the method according to any one of the above (1) to (12) or the silver nanoparticle-containing ink according to any one of the above (13) to (24), and then, calcining the silver nanoparticle-containing ink to form a silver conductive layer. The calcining is performed at a temperature of 200° C. or less, for example, 150° C. or less, preferably 120° C. or less, for 2 hours or less, for example, 1 hour or less, preferably 30 minutes or less, more preferably 15 minutes or less. More specifically, the calcining is performed under conditions of about 90° C. to 120° C. and about 10 minutes to 15 minutes, for example, 120° C. and 15 minutes.

A method for producing metal nanoparticle-containing ink, comprising:

mixing a metal compound with amines comprising an aliphatic hydrocarbon monoamine (A) comprising an aliphatic hydrocarbon group and one amino group, said aliphatic hydrocarbon group having 6 or more carbon atoms in total; and further comprising at least one of: an aliphatic hydrocarbon monoamine (B) comprising an aliphatic hydrocarbon group and one amino group, said aliphatic hydrocarbon group having 5 or less carbon atoms in total; and an aliphatic hydrocarbon diamine (C) comprising an aliphatic hydrocarbon group and two amino groups, said aliphatic hydrocarbon group having 8 or less carbon atoms in total; to form a complex compound comprising the metal compound and the amines;

thermally decomposing the complex compound by heating to form metal nano-particles; and dispersing the metal nano-particles in a dispersion solvent containing an alicyclic hydrocarbon.

Metal nanoparticle-containing ink comprising metal nano-particles and a dispersion solvent that disperses the metal nano-particles, wherein the metal nano-particles are formed by:

mixing a metal compound with amines comprising an aliphatic hydrocarbon monoamine (A) comprising an aliphatic hydrocarbon group and one amino group, said aliphatic hydrocarbon group having 6 or more carbon atoms in total; and further comprising at least one of: an aliphatic hydrocarbon monoamine (B) comprising an aliphatic hydrocarbon group and one amino group, said aliphatic hydrocarbon group having 5 or less carbon atoms in total; and an aliphatic hydrocarbon diamine (C) comprising an aliphatic hydrocarbon group and two amino groups, said aliphatic hydrocarbon group having 8 or less carbon atoms in total; to form a complex compound comprising the metal compound and the amines; and thermally decomposing the complex compound by heating; and wherein the dispersion solvent contains an alicyclic hydrocarbon.

Metal nanoparticle-containing ink comprising metal nano-particles whose surfaces are coated with a protective agent, and a dispersion solvent that disperses the metal nano-particles, wherein the protective agent comprises an aliphatic hydrocarbon monoamine (A) comprising an aliphatic hydrocarbon group and one amino group, said aliphatic hydrocarbon group having 6 or more carbon atoms in total; and further comprises at least one of: an aliphatic hydrocarbon monoamine (B) comprising an aliphatic hydrocarbon group and one amino group, said aliphatic hydrocarbon group having 5 or less carbon atoms in total; and an aliphatic hydrocarbon diamine (C) comprising an aliphatic hydrocarbon group and two amino groups, said aliphatic hydrocarbon group having 8 or less carbon atoms in total; and wherein the dispersion solvent contains an alicyclic hydrocarbon.

Effects of the Invention

In the present invention, as aliphatic amine compounds that function as a complex-forming agent and/or a protective agent, an aliphatic hydrocarbon monoamine (A) having 6 or more carbon atoms in total, and at least one of an aliphatic hydrocarbon monoamine (B) having 5 or less carbon atoms in total and an aliphatic hydrocarbon diamine (C) having 8 or less carbon atoms in total are used, and, silver nano-particles whose surfaces are coated with these aliphatic amine compounds are formed.

The aliphatic hydrocarbon monoamine (B) and the aliphatic hydrocarbon diamine (C) each have a short carbon chain, and are therefore easily removed from the surfaces of the silver particles in a short time of 2 hours or less, for example, 1 hour or less, preferably 30 minutes or less even by low-temperature calcining at a temperature of 200° C. or less, for example, 150° C. or less, preferably 120° C. or less. In addition, the presence of the monoamine (B) and/or the diamine (C) reduces the amount of the aliphatic hydrocarbon monoamine (A) adhered to the surfaces of the silver particles. This makes it possible to easily remove these aliphatic amine compounds from the surfaces of the silver particles in such a short time as described above even by low-temperature calcining at such a low temperature as described above, thereby allowing the silver particles to be sufficiently sintered.

The silver nano-particles whose surfaces are coated with these aliphatic amine compounds are dispersed in a dispersion solvent containing an alicyclic hydrocarbon. The alicyclic hydrocarbon solvent stably and well disperses the silver nano-particles whose surfaces are coated with the aliphatic amine compounds having a short carbon chain.

As described above, according to the present invention, it is possible to provide silver nanoparticle-containing ink that develops excellent conductivity (low resistance value) by low-temperature calcining and has silver nano-particles stably and well dispersed in a dispersion solvent, and a method for producing the silver nanoparticle-containing ink. The silver nanoparticle-containing ink according to the present invention is suitable for ink-jet applications. The present invention is also applied to metal nanoparticle-containing ink containing a metal other than silver, and a method for producing the metal nanoparticle-containing ink. According to the present invention, it is possible to form a conductive film or a conductive line even on any plastic substrate having low heat resistance such as a PET substrate or a polypropylene substrate.

MODES FOR CARRYING OUT THE INVENTION

In the present invention, first, silver nano-particles are formed.

In a method for forming silver nano-particles, first, an amine mixture liquid is prepared which comprises:

an aliphatic hydrocarbon monoamine (A) comprising an aliphatic hydrocarbon group and one amino group, said aliphatic hydrocarbon group having 6 or more carbon atoms in total; and further comprises at last one of:

an aliphatic hydrocarbon monoamine (B) comprising an aliphatic hydrocarbon group and one amino group, said aliphatic hydrocarbon group having 5 or less carbon atoms in total; and an aliphatic hydrocarbon diamine (C) comprising an aliphatic hydrocarbon group and two amino groups, said aliphatic hydrocarbon group having 8 or less carbon atoms in total. Then, a silver compound and the amine mixture liquid are mixed with each other to form a complex compound comprising the silver compound and the amines. However, mixing of the silver compound and the amines does not necessarily need to be performed using the amines in a mixture state. The amines may be added sequentially to the silver compound.

Then, the complex compound is thermally decomposed by heating to form silver nano-particles. Thus, the method for producing silver nano-particles according to the present invention mainly includes a preparation step for an amine mixture liquid, a forming step of a complex compound, and a thermal-decomposition step of the complex compound.

In this description, the term "nano-particles" means that primary particles have a size (average primary particle diameter) of less than 1,000 nm. The particle size refers to the size of a particle not including a protective agent (a stabilizer) present on (coating) the surface of the particle (i.e., refers to the size of silver itself). In the present invention, the silver nano-particles have an average primary particle diameter of, for example, 0.5 nm to 100 nm, preferably 0.5 nm to 50 nm, more preferably 0.5 nm to 25 nm, even more preferably 0.5 nm to 20 nm.

The silver compound used in the present invention is one that is easily decomposed by heating to generate metallic silver. Examples of such a silver compound that can be used include: silver carboxylates such as silver formate, silver acetate, silver oxalate, silver malonate, silver benzoate, and silver phthalate; silver halides such as silver fluoride, silver chloride, silver bromide, and silver iodide; silver sulfate, silver nitrate, silver carbonate, and the like. In terms of the fact that metallic silver is easily generated by decomposition and impurities other than silver are less likely to be generated, silver oxalate is preferably used. Silver oxalate is advantageous in that silver oxalate has a high silver content, and metallic silver is directly obtained by thermal decomposition without the need for a reducing agent, and therefore impurities derived from a reducing agent are less likely to remain.

When metal nano-particles containing another metal other than silver are produced, a metal compound that is easily decomposed by heating to generate a desired metal is used instead of the silver compound. As such a metal compound, a metal salt corresponding to the above mentioned silver compound can be used. Examples of such a metal compound include: metal carboxylates; metal halides; and metal salt compounds such as metal sulfates, metal nitrates, and metal carbonates. Among them, in terms of the fact that a metal is easily generated by decomposition and impurities other than a metal are less likely to be generated, metal oxalate is preferably used. Examples of another metal include Al, Au, Pt, Pd, Cu, Co, Cr, In, and Ni.

Further, in order to obtain a composite with silver, the above mentioned silver compound and the above mentioned compound of another metal other than silver may be used in combination. Examples of another metal include Al, Au, Pt, Pd, Cu, Co, Cr, In, and Ni. The silver composite is composed of silver and one or more other metals, and examples thereof include Au—Ag, Ag—Cu, Au—Ag—Cu, Au—Ag—Pd, and the like. The amount of silver occupies at least 20 wt %, usually at least 50 wt %, for example, at least 80 wt % of the total amount of the metals.

In the present invention, as aliphatic hydrocarbon amine compounds that function as a complex-forming agent and/or a protective agent, an aliphatic hydrocarbon amine (A) having 6 or more carbon atoms in total, and further at least one of an aliphatic hydrocarbon amine (B) having 5 or less carbon atoms in total and an aliphatic hydrocarbon diamine (C) having 8 or less carbon atoms in total are used.

Although established, the "aliphatic hydrocarbon monoamine" in this description refers to a compound composed of one to three monovalent aliphatic hydrocarbon groups and one amino group. The "hydrocarbon group" refers to a group only composed of carbon and hydrogen. However, if necessary, each of the aliphatic hydrocarbon monoamine (A) and the aliphatic hydrocarbon monoamine (B) may have, on its hydrocarbon group, a substituent group containing a hetero atom (atom other than carbon and hydrogen) such as an oxygen atom or a nitrogen atom.

Further, the "aliphatic hydrocarbon diamine" refers to a compound composed of a bivalent aliphatic hydrocarbon group (alkylene group), two amino groups between which said aliphatic hydrocarbon group is interposed, and, if necessary, aliphatic hydrocarbon group(s) (alkyl group(s)) substituted for hydrogen atom(s) on the amino group(s). However, if necessary, the aliphatic hydrocarbon diamine (C) may have, on its hydrocarbon group, a substituent group containing a hetero atom (atom other than carbon and hydrogen) such as an oxygen atom or a nitrogen atom.

The aliphatic hydrocarbon monoamine (A) having 6 or more carbon atoms in total has, due to its hydrocarbon chain, high performance as a protective agent (a stabilizer) onto the surfaces of resulting silver particles.

The aliphatic hydrocarbon monoamine (A) includes a primary amine, a secondary amine, and a tertiary amine. Examples of the primary amine include saturated aliphatic hydrocarbon monoamines (i.e., alkylmonoamines) such as hexylamine, heptylamine, octylamine, nonylamine, decylamine, undecylamine, dodecylamine, tridecylamine, tetradecylamine, pentadecylamine, hexadecylamine, heptadecylamine, and octadecylamine. Examples of the saturated aliphatic hydrocarbon monoamine other than the above-mentioned linear aliphatic monoamines include branched aliphatic hydrocarbon amines such as isohexylamine, 2-ethylhexylamine, and tert-octylamine. Another example of the saturated aliphatic hydrocarbon monoamine includes cyclohexylamine. Other examples of the primary amine include unsaturated aliphatic hydrocarbon monoamines (i.e., alkenylmonoamines) such as oleylamine.

Examples of the secondary amine include dialkylmonoamines such as N,N-dipropylamine, N,N-dibutylamine, N,N-dipentylamine, N,N-dihexylamine, N,N-dipeptylamine, N,N-dioctylamine, N,N-dinonylamine, N,N-didecylamine, N,N-diundecylamine, N,N-didodecylamine, N-methyl-N-propylamine, N-ethyl-N-propylamine, and N-propyl-N-butylamine. Examples of the tertiary amine include tributylamine, trihexylamine, and the like.

Among them, saturated aliphatic hydrocarbon monoamines having 6 or more carbon atoms are preferred. When the number of carbon atoms is 6 or more, space can be secured between silver particles by adsorption of amino groups to the surfaces of the silver particles, thereby improving the effect of preventing agglomeration of the silver particles. The upper limit of the number of carbon atoms is not particularly limited, but saturated aliphatic monoamines having up to 18 carbon atoms are usually preferred in consideration of ease of availability, ease of removal during calcining, etc. Particularly, alkylmonoamines having 6 to 12 carbon atoms such as hexylamine, heptylamine, octylamine, nonylamine, decylamine, undecylamine, and dodecylamine are preferably used. The above-mentioned aliphatic hydrocarbon monoamines (A) may be used singly or in combination of two or more of them.

The aliphatic hydrocarbon monoamine (B) having 5 or less carbon atoms in total has a shorter carbon chain than the aliphatic monoamine (A) having 6 or more carbon atoms in total, and therefore the function of the aliphatic hydrocarbon monoamine (B) itself as a protective agent (a stabilizer) is considered to be low. However, the aliphatic hydrocarbon monoamine (B) has a high ability to coordinate to silver in the silver compound due to its higher polarity than the aliphatic monoamine (A), and is therefore considered to have the effect of promoting complex formation. In addition, the aliphatic hydrocarbon monoamine (B) has a short carbon chain, and therefore can be removed from the surfaces of silver particles in a short time of 30 minutes or less, or 20 minutes or less, even by low-temperature calcining at a temperature of, for example, 120° C. or less, or about 100° C. or less, which is effective for low-temperature calcining of resulting silver nano-particles.

Examples of the aliphatic hydrocarbon monoamine (B) include saturated aliphatic hydrocarbon monoamines (i.e., alkylmonoamines) having 2 to 5 carbon atoms such as ethylamine, n-propylamine, isopropylamine, n-butylamine, isobutylamine, sec-butylamine, tert-butylamine, pentylamine, isopentylamine, and tert-pentylamine. Other examples of the aliphatic hydrocarbon monoamine (B) include dialkylmonoamines such as N,N-dimethylamine and N,N-diethylamine.

Among them, n-butylamine, isobutylamine, sec-butylamine, tert-butylamine, pentylamine, isopentylamine, tert-pentylamine, and the like are preferred, and the above-mentioned butylamines are particularly preferred. The above-mentioned aliphatic hydrocarbon monoamines (B) may be used singly or in combination of two or more of them.

The aliphatic hydrocarbon diamine (C) having 8 or less carbon atoms in total has a high ability to coordinate to silver in the silver compound, and therefore has the effect of promoting complex formation. Generally, aliphatic hydrocarbon diamines have higher polarity than aliphatic hydrocarbon monoamines, and therefore have a high ability to coordinate to silver in a silver compound. Further, the aliphatic hydrocarbon diamine (C) has the effect of promoting lower-temperature and shorter-time thermal decomposition in the thermal-decomposition step of the complex compound, and therefore production of silver nano-particles can be more efficiently conducted. Further, a protective film containing the aliphatic diamine (C) on silver particles has high polarity, which improves the dispersion stability of the silver particles in a dispersion medium comprising a highly-polar solvent. Furthermore, the aliphatic diamine (C) has a short carbon chain, and therefore can be removed from the surfaces of silver particles in a short time of 30 minutes or less, or 20 minutes or less, even by low-temperature calcining at a temperature of, for example, 120° C. or less, or about 100° C. or less, which is effective for low-temperature and short-time calcining of resulting silver nano-particles.

The aliphatic hydrocarbon diamine (C) is not particularly limited, and examples thereof include ethylenediamine, N,N-dimethylethylenediamine, N,N'-dimethylethylenediamine, N,N-diethylethylenediamine, N,N'-diethylethylenediamine, 1,3-propanediamine, 2,2-dimethyl-1,3-propanediamine, N,N-dimethyl-1,3-propanediamine, N,N'-dimethyl- 1,3-propanediamine, N,N-diethyl-1,3-propanediamine, N,N-diethyl-1,3-propanediamine, 1,4-butanediamine, N,N-dimethyl-1,4-butanediamine, N,N'-dimethyl-1,4-butanediamine, N,N-diethyl-1,4-butanediamine, N,N'-diethyl-1,4-butanediamine, 1,5-pentanediamine, 1,5-diamino-2-methylpentane, 1,6-hexanediamine, N,N-dimethyl-1,6-hexanediamine, N,N'-dimethyl-1,6-hexanediamine, 1,7-heptanediamine, 1,8-octanediamine, and the like. They are all alkylenediamines having 8 or less carbon atoms in total in which at least one of the two amino groups is a primary amino group or a secondary amino group, and have a high ability to coordinate to silver in the silver compound, and therefore have the effect of promoting complex formation.

Among them, N,N-dimethylethylenediamine, N,N-diethylethylenediamine, N,N-dimethyl-1,3-propanediamine, N,N-diethyl-1,3-propanediamine, N,N-dimethyl-1,4-butanediamine, N,N-diethyl-1,4-butanediamine, N,N-dimethyl-1,6-hexanediamine, and the like are preferred, which are alkylenediamines having 8 or less carbon atoms in total in which one of the two amino groups is a primary amino group ($-NH_2$) and the other is a tertiary amino group ($-NR^1R^2$). Such preferred alkylenediamines are represented by the following structural formula:

wherein R represents a bivalent alkylene group, $R^1$ and $R^2$ may be the same or different from each other and each represent an alkyl group, and the total number of carbon atoms of R, $R^1$, and $R^2$ is 8 or less. The alkylene group does not usually contain a hetero atom (atom other than carbon and hydrogen) such as an oxygen atom or a nitrogen atom, but if necessary, may have a substituent group containing such a hetero atom. Further, the alkyl group does not usually contain a hetero atom such as an oxygen atom or a nitrogen atom, but if necessary, may have a substituent group containing such a hetero atom.

When one of the two amino groups is a primary amino group, the ability to coordinate to silver in the silver compound is high, which is advantageous for complex formation, and when the other is a tertiary amino group, a resulting complex is prevented from having a complicated network structure because a tertiary amino group has a poor ability to coordinate to a silver atom. If a complex has a complicated network structure, there is a case where the thermal-decomposition step of the complex requires a high temperature. Among these diamines, those having 6 or less carbon atoms in total are preferred, and those having 5 or less carbon atoms in total are more preferred in terms of the fact that they can be removed from the surfaces of silver particles in a short time even by low-temperature calcining. The above-mentioned aliphatic hydrocarbon diamines (C) may be used singly or in combination of two or more of them.

The ratio between the aliphatic hydrocarbon monoamine (A) having 6 or more carbon atoms in total, and one or both of the aliphatic hydrocarbon monoamine (B) having 5 or less carbon atoms in total and the aliphatic hydrocarbon diamine (C) having 8 or less carbon atoms in total used in the present invention is not particularly limited. For example, the amount of the aliphatic monoamine (A) may be 5 mol % to 65 mol %; and
the total amount of the aliphatic monoamine (B) and the aliphatic diamine (C) may be 35 mol % to 95 mol %, on the basis of the total amount of the amines [ (A)+(B)+(C)]. By setting the content of the aliphatic monoamine (A) to 5 mol % to 65 mol %, the carbon chain of the component (A) can easily fulfill its function of protecting and stabilizing the surfaces of resulting silver particles. If the content of the component (A) is less than 5 mol %, there is a case where the protective and stabilization function is poorly developed. On the other hand, if the content of the component (A) exceeds 65 mol %, the protective and stabilization function is sufficient, but the component (A) is poorly removed by low-temperature calcining.

When the aliphatic monoamine (A), and further both the aliphatic monoamine (B) and the aliphatic diamine (C) are used, the ratio among them used is not particularly limited. For example,
the amount of the aliphatic monoamine (A) may be 5 mol % to 65 mol %;
the amount of the aliphatic monoamine (B) may be 5 mol % to 70 mol %; and
the amount of the aliphatic diamine (C) may be 5 mol % to 50 mol %, on the basis of the total amount of the amines [(A)+(B)+(C)].

In this case, the lower limit of the content of the component (A) is preferably 10 mol % or more, more preferably 20 mol % or more. The upper limit of the content of the component (A) is preferably 65 mol % or less, more preferably 60 mol % or less.

By setting the content of the aliphatic monoamine (B) to 5 mol % to 70 mol %, the effect of promoting complex formation is easily obtained, the aliphatic monoamine (B) itself can contribute to low-temperature and short-time calcining, and the effect of facilitating the removal of the aliphatic diamine (C) from the surfaces of silver particles during calcining is easily obtained. If the content of the component (B) is less than 5 mol %, there is a case where the effect of promoting complex formation is poor, or the component (C) is poorly removed from the surfaces of silver particles during calcining. On the other hand, if the content of the component (B) exceeds 70 mol %, the effect of promoting complex formation is obtained, but the content of the aliphatic monoamine (A) is relatively reduced so that the surfaces of resulting silver particles are poorly protected and stabilized. The lower limit of the content of the component (B) is preferably 10 mol % or more, more preferably 15 mol % or more. The upper limit of the content of the component (B) is preferably 65 mol % or less, more preferably 60 mol % or less.

By setting the content of the aliphatic diamine (C) to 5 mol % to 50 mol %, the effect of promoting complex formation and the effect of promoting the thermal-decomposition of the complex are easily obtained, and further, the dispersion stability of silver particles in a dispersion medium containing a highly-polar solvent is improved because a protective film containing the aliphatic diamine (C) on silver particles has high polarity. If the content of the component (C) is less than 5 mol %, there is a case where the effect of promoting complex formation and the effect of promoting the thermal-decomposition of the complex are poor. On the other hand, if the content of the component (C) exceeds 50 mol %, the effect of promoting complex formation and the effect of promoting the thermal-decomposition of the complex are obtained, but the content of the aliphatic monoamine (A) is relatively reduced so that the surfaces of resulting silver particles are poorly protected and stabilized. The lower limit of the content of the component (C) is preferably 5 mol % or more, more preferably 10 mol % or more. The upper limit of the content of the component (C) is preferably 45 mol % or less, more preferably 40 mol % or less.

When the aliphatic monoamine (A) and the aliphatic monoamine (B) are used (without using the aliphatic diamine (C)), the ratio between them used is not particularly limited. For example, in consideration of the above-described functions of these components,
the amount of the aliphatic monoamine (A) may be 5 mol % to 65 mol %; and
the amount of the aliphatic monoamine (B) may be 35 mol % to 95 mol %,
on the basis of the total amount of the amines [(A)+(B)].

When the aliphatic monoamine (A) and the aliphatic diamine (C) are used (without using the aliphatic monoamine (B)), the ratio between them used is not particularly limited. For example, in consideration of the above-described functions of these components,
the amount of the aliphatic monoamine (A) may be 5 mol % to 65 mol %; and
the amount of the aliphatic diamine (C) may be 35 mol % to 95 mol %,
on the basis of the total amount of the amines [(A)+(C)].

The above ratios among/between the aliphatic monoamine (A) and the aliphatic monoamine (B) and/or the aliphatic diamine (C) used are examples and may be changed in various manners.

In the present invention, the use of the aliphatic monoamine (B) and/or the aliphatic diamine (C) each having a high ability to coordinate to silver in the silver compound makes it possible, depending on their contents, to reduce the amount of the aliphatic monoamine (A) having 6 or more carbon atoms in total adhered to the surfaces of silver particles. Therefore, these aliphatic amine compounds are easily removed from the surfaces of silver particles even by the above-described low-temperature and short-time calcining so that the silver particles are sufficiently sintered.

In the present invention, the total amount of the amines [(A), (B) and/or (C)] is not particularly limited, but may be about 1 to 50 moles as the total amount of the amine components [(A)+(B)+(C)] per 1 mole of silver atoms in the silver compound as a starting material. If the total amount of the amine components [(A)+(B)+(C)] is less than 1 mole per 1 mole of the silver atoms, there is a possibility that part of the silver compound remains without being converted to a complex compound in the complex compound-forming step so that, in the subsequent thermal decomposition step, silver particles have poor uniformity and become enlarged or the silver compound remains without being thermally decomposed. On the other hand, it is considered that even when the total amount of the amine components [(A)+(B)+(C)] exceeds about 50 moles per 1 mole of the silver atoms, there are few advantages. In order to prepare a dispersion liquid of silver nano-particles in substantially the absence of solvent, the total amount of the amine components may be, for example, about 2 or more moles. By setting the total amount of the amine components to about 2 to 50 moles, the complex compound-forming step and the thermal-decomposition step of the complex compound can be successfully performed. The lower limit of the total amount of the amine components is preferably 2 moles or more, more preferably 6 moles or more, per 1 mole of silver atoms in the silver compound. It is to be noted that the molecule of silver oxalate contains two silver atoms.

In the present invention, an aliphatic carboxylic acid (D) may further be used as a stabilizer to further improve the dispersibility of silver nano-particles in a dispersion medium. The aliphatic carboxylic acid (D) may be used together with the above-described amines, and may be used by adding to the liquid amine mixture. The use of the aliphatic carboxylic acid (D) may improve the stability of silver nano-particles, especially the stability of silver nano-particles in a coating material state where the silver nano-particles are dispersed in an organic solvent.

As the aliphatic carboxylic acid (D), a saturated or unsaturated aliphatic carboxylic acid is used. Examples of the aliphatic carboxylic acid include saturated aliphatic monocarboxylic acids having 4 or more carbon atoms such as butanoic acid, pentanoic acid, hexanoic acid, heptanoic acid, octanoic acid, nonanoic acid, decanoic acid, undecanoic acid, dodecanoic acid, tridecanoic acid, tetradecanoic acid, pentadecanoic acid, hexadecanoic acid, heptadecanoic acid, octadecanoic acid, nonadecanoic acid, icosanoic acid, and eicosenoic acid; and unsaturated aliphatic monocarboxylic acids having 8 or more carbon atoms such as oleic acid, elaidic acid, linoleic acid, and palmitoleic acid.

Among them, saturated or unsaturated aliphatic monocarboxylic acids having 8 to 18 carbon atoms are preferred. When the number of carbon atoms is 8 or more, space can be secured between silver particles by adsorption of carboxylic groups to the surfaces of the silver particles, thereby improving the effect of preventing agglomeration of the silver particles. In consideration of ease of availability, ease of removal during calcining, etc., saturated or unsaturated aliphatic monocarboxylic compounds having up to 18 carbon atoms are usually preferred. Particularly, octanoic acid, oleic acid, and the like are preferably used. The above-mentioned aliphatic carboxylic acids (D) may be used singly or in combination of two or more of them.

When the aliphatic carboxylic acid (D) is used, the amount of the aliphatic carboxylic acid (D) used may be, for example, about 0.05 to 10 moles, preferably 0.1 to 5 moles, more preferably 0.5 to 2 moles per 1 mole of silver atoms in the silver compound as a starting material. If the amount of the component (D) is less than 0.05 moles per 1 mole of the silver atoms, the effect of improving dispersion stability obtained by adding the component (D) is poor. On the other hand, if the amount of the component (D) reaches 10 moles, the effect of improving dispersion stability is saturated and the component (D) is poorly removed by low-temperature calcining. It is to be noted that the aliphatic carboxylic acid (D) does not necessarily need to be used.

In the present invention, an amine mixture liquid containing the aliphatic monoamine (A) and further one or both of the aliphatic monoamine (B) and the aliphatic diamine (C) is firstly prepared [preparation step for amine mixture liquid].

The amine mixture liquid can be prepared by stirring the amine component (A), the amine component (B) and/or the amine component (C), and if used, the carboxylic acid component (D) in a given ratio at a room temperature.

Then, the amine mixture liquid containing the amine component (A), the amine component (B), and the amine component (C) is mixed with the silver compound to form a complex compound containing the silver compound and the amines (complex compound-forming step). When metal nano-particles containing another metal other than silver are produced, a metal compound containing a desired metal is used instead of the silver compound.

The silver compound (or the metal compound) in powder form, and a given amount of the amine mixture liquid are mixed. At this time, the mixing may be performed by stirring them at a room temperature, or may be performed by stirring them while a mixture of them is appropriately cooled to a room temperature or less because the coordination reaction of the amines to the silver compound (or the metal compound) is accompanied by heat generation. The excess amines function as a reaction medium. When a complex compound is formed, the formed complex compound generally exhibits a color corresponding to its components, and therefore the endpoint of a complex compound-forming reaction can be determined by detecting the end of a change in the color of a reaction mixture by an appropriate spectroscopic method or the like. A complex compound formed from silver oxalate is generally colorless (appears white to our eyes), but even in such a case, it is possible to determine the state of formation of a complex compound based on a change in the form of a reaction mixture such as a change in viscosity. In this way, a silver-amine complex (or a metal-amine complex) is obtained in a medium mainly containing the amines.

Then, the obtained complex compound is thermally decomposed by heating to form silver nano-particles [thermal-decomposition step of complex compound]. When a metal compound containing another metal other than silver is used, desired metal nano-particles are formed. The silver nano-particles (metal nano-particles) are formed without using a reducing agent. However, if necessary, an appropriate reducing agent may be used without impairing the effects of the present invention.

In such a metal-amine complex decomposition method, the amines generally play a role in controlling the mode of formation of fine-particles by agglomeration of an atomic metal generated by decomposition of the metal compound, and in forming film on the surfaces of the formed metal fine-particles to prevent reagglomeration of the fine-particles. That is, it is considered that when the complex compound of the metal compound and the amine is heated, the metal compound is thermally decomposed to generate an atomic metal while the coordination bond of the amine to a metallic atom is maintained, and then the metallic atoms coordinated with the amine are agglomerated to form metal nano-particles coated with an amine protective film.

At this time, the thermal decomposition is preferably performed by stirring the complex compound in a reaction medium mainly containing the amines. The thermal decomposition may be performed in a temperature range in which coated silver nano-particles (or coated metal nano-particles) are formed, but from the viewpoint of preventing the elimination of the amine from the surfaces of silver particles (or from the surfaces of metal particles), the thermal decomposition is preferably performed at a temperature as low as possible within such a temperature range. In case of the complex compound from silver oxalate, the thermal decomposition temperature may be, for example, about 80° C. to 120° C., preferably about 95° C. to 115° C., more specifically about 100° C. to 110° C. In case of the complex compound from silver oxalate, heating at about 100° C. allows decomposition and reduction of silver ions to occur so that coated silver nano-particles can be obtained. Further, the thermal decomposition of silver oxalate itself generally occurs at about 200° C. The reason why the thermal decomposition temperature of a silver oxalate-amine complex compound is about 100° C. lower than that of silver oxalate itself is not clear, but it is estimated that a coordination polymer structure formed by pure silver oxalate is broken by forming a complex compound of silver oxalate with the amine.

Further, the thermal decomposition of the complex compound is preferably performed in an inert gas atmosphere such as argon, but may be performed in the atmosphere.

When the complex compound is thermally decomposed, a suspension exhibiting a glossy blue color is obtained. Then, the excess amines, etc. are removed from the suspension by, for example, sedimentation of silver nano-particles (or metal nano-particles) and decantation and washing with an appropriate solvent (water or an organic solvent) to obtain desired stable coated silver nano-particles (or coated metal nano-particles) [silver nano-particle post-treatment step]. After the washing, the coated silver nano-particles are dried to obtain a powder of the desired stable coated silver nano-particles (or coated metal nano-particles). However, wet silver nano-particles may be used to prepare silver nanoparticle-containing ink.

The decantation and washing are performed using water or an organic solvent. Examples of the organic solvent that may be used include aliphatic hydrocarbon solvents such as pentane, hexane, heptane, octane, nonane, decane, undecane, dodecane, tridecane, and tetradecane; alicyclic hydrocarbon solvents such as cyclohexane; aromatic hydrocarbon solvents such as toluene, xylene, and mesitylene; alcohol solvents such as methanol, ethanol, propanol, and butanol; acetonitrile; and mixed solvents of them.

The step of forming the silver nano-particles according to the present invention does not require the use of a reducing agent. Therefore, a by-product derived from a reducing agent is not formed, coated silver nano-particles are easily separated from a reaction system, and high-purity coated silver nano-particles are obtained. However, if necessary, an appropriate reducing agent may be used without impairing the effects of the present invention.

In this way, silver nano-particles whose surfaces are coated with a protective agent used are formed. The protective agent comprises, for example, the aliphatic monoamine (A), and further one or both of the aliphatic monoamine (B) and the aliphatic diamine (C), and further if used, the carboxylic acid (D). The ratio among/between them contained in the protective agent is the same as the ratio among/between them used in the amine mixture liquid. The same goes for the metal nano-particles.

Then, the silver nano-particles formed in such a manner as described above are dispersed in a dispersion solvent (dispersion medium) containing an alicyclic hydrocarbon to prepare silver nanoparticle-containing ink.

In the present invention, the dispersion solvent contains an alicyclic hydrocarbon. Although established, the "alicyclic hydrocarbon" refers to a carbocyclic compound other than an aromatic compound, which contains only carbon and hydrogen. The alicyclic hydrocarbon includes a cycloalkane having a saturated carbon ring, and a cycloalkene and a cycloalkyne whose carbon rings have an unsaturated bond; and further includes a compound having a monocyclic or polycyclic (e.g., bicyclic or tricyclic) structure. In the present invention, the alicyclic hydrocarbon is liquid at ordinary temperature (25° C.), and is, for example, a compound containing a six- to twelve-membered ring structure. The alicyclic hydrocarbon is preferably a compound containing a six-membered ring structure.

Examples of the alicyclic hydrocarbon containing a six-membered ring structure include cyclohexanes, a terpene-based six-membered ring compound, and decalin.

Examples of the cyclohexanes include cyclohexane (boiling point (bp): 80.7° C.); cyclohexanes substituted with a lower alkyl group having 1 to 6 carbon atoms such as methylcyclohexane (bp: 100.4° C.), ethylcyclohexane (bp: 132° C.), n-propylcyclohexane (bp: 157° C.), isopropylcyclohexane (bp: 151° C.), n-butylcyclohexane (bp: 180° C.), isobutylcyclohexane (bp: 169° C.), sec-butylcyclohexane (bp: 179° C.), and tert-butylcyclohexane (bp: 171° C.); and bicyclohexyl (bp: 227° C.)

Examples of the terpene-based six-membered ring compound include monocyclic monoterpenes such as α-pinene (bp: 155 to 156° C.), β-pinene (bp: 164 to 166° C.), limonene (bp: 175.5 to 176° C., 763 mmHg° C.), α-terpinene (bp: 173.5 to 174.8° C., 755 mmHg), β-terpinene (bp: 173 to 174° C.), γ-terpinene (bp: 183° C.), and terpinolene (bp: 186° C.).

Examples of the alicyclic hydrocarbon containing a ring structure other than a six-membered ring structure include cycloheptane (bp: 118 to 120° C.), cycloheptene (bp: 115° C.), cyclooctane (bp: 148 to 149° C., 749 mmHg), cyclooctene (bp: 145 to 146° C.), cyclodecane (bp: 201° C.), and cyclododecene (bp: 241° C.)

Cyclododecane (melting point: 63° C.) is solid at ordinary temperature, but may be used by dissolving in the above-listed alicyclic hydrocarbon that is liquid at ordinary temperature.

Examples of the compound having a polycyclic structure include decalin [(cis form, bp: 195.7° C.; trans form, 185.5° C.] and bicyclo[2,2,2]octane (bp: 169.5 to 170.5 mmHg).

Among them, cyclohexanes substituted with an alkyl group having 3 to 4 carbon atoms, such as n-propylcyclohexane, isopropylcyclohexane, and n-butylcyclohexane; terpene-based compounds such as limonene and terpinene; and compounds having a polycyclic structure, such as decalin, are preferred.

The alicyclic hydrocarbon is more compact in molecular size and has a higher boiling point than a chain hydrocarbon having the same carbon atoms. For example, cyclohexane has a bp of 80.7° C., whereas n-hexane has a bp of 69° C. Incidentally, 1-hexanol has a bp of 157.47° C. Cyclooctane has a bp of 148 to 149° C. (749 mmHg), whereas n-octane has a bp of 125.7° C. Incidentally, 1-octanol has a bp of 195.28° C.

The use of the alicyclic hydrocarbon makes it possible to well disperse the silver nano-particles whose surfaces are coated with an amine protective agent having a short carbon chain. It is estimated that the alicyclic hydrocarbon is sterically more compact than a chain hydrocarbon, and therefore easily flows into gaps between agglomerated particles and has the function of loosening agglomerated particles.

Further, the alicyclic hydrocarbon has a relatively high boiling point, and is less likely to volatilize at an ambient temperature at which the silver nanoparticle-containing ink is used (e.g., at about ordinary temperature (25° C.)). Therefore, even when the silver nanoparticle-containing ink is used for ink-jet printing, clogging of an ink-jet head does not occur. If the volatility of the dispersion solvent is high, the concentration of the silver nanoparticle-containing ink gradually increases in an environment where the ink is used so that clogging of an ink-jet head is likely to occur. Further, even in other printing methods other than ink-jet printing, high volatility of the dispersion solvent is not preferred. However, when an alicyclic hydrocarbon solvent having too high a boiling point is used to suppress volatility, conductive performance is less likely to be achieved unless calcining is performed at high temperatures. In this regard, caution should be taken. The above-mentioned alicyclic hydrocarbons may be used singly or in combination of two or more of them.

In the present invention, the alicyclic hydrocarbon solvent is preferably contained in the dispersion solvent in an amount of 10 to 90 wt %. When the content of the alicyclic hydrocarbon solvent is in the above weight range, the effect of the alicyclic hydrocarbon solvent is easily obtained. If the content of the alicyclic hydrocarbon solvent is less than 10 wt %, the effect of the alicyclic hydrocarbon solvent is poor. On the other hand, the alicyclic hydrocarbon solvent may be used in an amount of more than 90 wt %, but another organic solvent that will be described below is preferably used in combination with the alicyclic hydrocarbon solvent in terms of dispersibility. The lower limit of the content of the alicyclic hydrocarbon solvent depends on the type of another organic solvent to be used in combination with the alicyclic hydrocarbon solvent, but is preferably 10 wt % or more, more preferably 15 wt % or more. The upper limit of the content of the alicyclic hydrocarbon solvent is preferably 90 wt % or less, more preferably 85 wt % or less.

In the present invention, the dispersion solvent preferably further contains other organic solvents in addition to the alicyclic hydrocarbon solvent. Examples of the other organic solvents include aliphatic hydrocarbon solvents such as pentane, hexane, heptane, octane, nonane, decane, undecane, dodecane, tridecane, and tetradecane; aromatic hydrocarbon solvents such as toluene, xylene, and mesitylene; and linear, branched, or cyclic aliphatic alcohol solvents such as methanol, ethanol, n-propanol, isopropanol, n-butanol, isobutanol, sec-butanol, tert-butanol, n-pentanol, n-hexanol, 2-ethylhexanol, n-heptanol, n-octanol, n-nonanol, n-decanol, undecanol, dodecanol, cyclopentanol, and cyclohexanol. The amount of the other organic solvent may be appropriately determined depending on a desired concentration or viscosity of the silver ink.

Among them, the other organic solvents are preferably aliphatic alcohols having 4 or more carbon atoms, and preferably aliphatic alcohols having 4 or more and 12 or less carbon atoms such as n-butanol (bp: 117° C.), isobutanol (bp: 108° C.), sec-butanol (bp: 99.5° C.), tert-butanol (bp: 83° C.), n-pentanol (bp: 138° C.), cyclopentanol (bp: 140° C.), n-hexanol (bp: 157.47° C.), 2-ethylhexanol (bp: 183.5° C.), cyclohexanol (bp: 163° C.), n-heptanol (bp: 176° C.), n-octanol (bp: 195.28° C.), n-nonanol (bp: 215° C.), n-decanol (bp: 230° C.), undecanol (bp: 250° C.), and dodecanol (bp: 261° C.). More preferred are aliphatic alcohols having 6 or more and 12 or less carbon atoms. These aliphatic alcohols may be used in combination with the alicyclic hydrocarbon solvent. The above-mentioned other organic solvents may be used singly or in combination of two or more of them.

The aliphatic alcohol having 4 or more carbon atoms is preferably contained in the dispersion solvent in an amount of 10 to 90 wt %. The lower limit of the content of the aliphatic alcohol is more preferably 10 wt % or more, more preferably 15 wt % or more. The upper limit of the content of the aliphatic alcohol is more preferably 90 wt % or less, more preferably 85 wt % or less.

That is, the dispersion solvent preferably contains the alicyclic hydrocarbon in an amount of 10 to 90 wt % and the aliphatic alcohol in an amount of 10 to 90 wt %. The total amount of both the alicyclic hydrocarbon and the aliphatic alcohol may be 100 wt %, or the other organic solvents described above may be further used in combination as the balance.

The powder of coated silver nano-particles in a dry or wet state obtained in the silver nano-particle post-treatment step and the above dispersion solvent are mixed together with stirring so that ink containing suspended silver nano-particles can be prepared. The amount of the silver nano-particles contained in the silver nanoparticle-containing ink depends on the intended use, but is, for example, 25 wt % or more, preferably 30 wt % or more. The upper limit of the content of the silver nano-particles is 80 wt % or less as a standard.

The silver nanoparticle-containing ink obtained in the present invention has excellent stability. The silver ink is stable at a silver concentration of, for example, 50 wt % at a room temperature for 1 month or more without the occurrence of agglomeration and fusion.

The prepared silver nanoparticle-containing ink is applied onto a substrate and is then calcined.

The application can be performed by a known method such as spin coating, inkjet printing, screen printing, dispenser printing, relief printing (flexography), dye sublimation printing, offset printing, laser printer printing (toner printing), intaglio printing (gravure printing), contact printing, or microcontact printing. The silver nanoparticle-containing ink according to the present invention contains the alicyclic hydrocarbon as a dispersion solvent, and is less likely to volatilize at an ambient temperature at which the silver nano-ink is used (e.g., at about ordinary temperature (25° C.)), and is therefore suitable for ink-jet printing applications. By using such a printing technique, a patterned silver ink coating layer is obtained, and a patterned silver conductive layer is obtained by calcining.

The calcining can be performed at 200° C. or less, for example, a room temperature (25° C.) or more and 150° C. or less, preferably a room temperature (25° C.) or more and 120° C. or less. However, in order to complete the sintering of silver by short-time calcining, the calcining may be performed at a temperature of 60° C. or more and 200° C. or less, for example, 80° C. or more and 150° C. or less, preferably 90° C. or more and 120° C. or less. The time of calcining may be appropriately determined in consideration of the amount of a silver ink applied, the calcining temperature, etc., and may be, for example, several hours (e.g., 3 hours, or 2 hours) or less, preferably 1 hour or less, more preferably 30 minutes or less, even more preferably 10 minutes to 20 minutes.

The silver nano-particles have such a constitution as described above, and are therefore sufficiently sintered even by such low-temperature and short-time calcining. As a result, excellent conductivity (low resistance value) is developed. A silver conductive layer having a low resistance value (e.g., 15 µΩcm or less, in the range of 7 to 15 µΩcm) is formed. The resistance value of bulk silver is 1.6 µΩcm.

Since the calcining can be performed at a low temperature, not only a glass substrate or a heat-resistant plastic substrate such as a polyimide-based film but also a general-purpose plastic substrate having low heat resistance, such as a polyester-based film, e.g., a polyethylene terephthalate (PET) film and a polyethylene naphthalate (PEN) film, or a polyolefin-based film, e.g., polypropylene film, can be suitably used as a substrate. Further, short-time calcining reduces the load on such a general-purpose plastic substrate having low heat resistance, and improves production efficiency.

The silver conductive material obtained according to the present invention can be applied to electromagnetic wave control materials, circuit boards, antennas, radiator plates, liquid crystal displays, organic EL displays, field emission displays (FEDs), IC cards, IC tags, solar cells, LED devices, organic transistors, condensers (capacitors), electronic paper, flexible batteries, flexible sensors, membrane switches, touch panels, EMI shields, and the like.

The thickness of the silver conductive layer may be appropriately determined depending on the intended use. The thickness of the silver conductive layer is not particularly limited, and may be selected from the range of, for example, 5 nm to 10 µm, preferably 100 nm to 5 µm, more preferably 300 nm to 2 µm.

The present invention has been described above with reference mainly to ink containing silver nano-particles, but is applied also to ink containing metal nano-particles containing a metal other than silver.

EXAMPLES

Hereinbelow, the present invention will be described more specifically with reference to examples, but is not limited to these examples.

Specific Resistance Value of Calcined Silver Film

The specific resistance value of an obtained calcined silver film was measured by a four-terminal method (Loresta GP MCP-T610). The measuring limit of this device is $10^{-7}$ Ωcm.

Reagents used in Examples and Comparative Examples are as follows:
N,N-Dimethyl-1,3-propanediamine (MW: 102.18): manufactured by Tokyo Chemical Industry Co., Ltd.;
n-Butylamine (MW: 73.14): reagent manufactured by Tokyo Chemical Industry Co., Ltd.;
Hexylamine (MW: 101.19): reagent manufactured by Tokyo Chemical Industry Co., Ltd.;
Octylamine (MW: 129.25): reagent manufactured by Tokyo Chemical Industry Co., Ltd.;
Oleic acid (MW: 282.47): reagent manufactured by Tokyo Chemical Industry Co., Ltd.;
Methanol: special grade reagent manufactured by Wako Pure Chemical Industries, Ltd.;
1-Butanol: special grade reagent manufactured by Wako Pure Chemical Industries, Ltd.;
Octane: special grade reagent manufactured by Wako Pure Chemical Industries, Ltd.;
Tetradecane: special grade reagent manufactured by Wako Pure Chemical Industries, Ltd.;
Methylcyclohexane: special grade reagent manufactured by Wako Pure Chemical Industries, Ltd.;
1-Decanol: special grade reagent manufactured by Wako Pure Chemical Industries, Ltd.;
Silver oxalate (MW: 303.78): synthesized from silver nitrate (manufactured by Wako Pure Chemical Industries, Ltd.) and oxalic acid dihydrate (manufactured by Wako Pure Chemical Industries, Ltd.).

Example 1

Preparation of Silver Nano-Particles 1.28 g (12.5 mmol) of N,N-dimethyl-1,3-propanediamine, 0.910 g (12.5 mmol) of n-butylamine, 3.24 g (32.0 mmol) of hexylamine, 0.39 g (3.0 mmol) of octylamine, and 0.09 g (0.33 mmol) of oleic acid were added to a 50-mL flask and stirred at a room temperature to prepare a homogeneous amine-carboxylic acid mixture solution.

3.04 g (10 mmol) of silver oxalate was added to the prepared mixture solution and stirred at a room temperature to convert silver oxalate to a viscous white substance. The stirring was terminated when such conversion was seemingly completed. In this way, a silver oxalate-amine complex was formed.

Then, the obtained reaction mixture was heated to 105° C. to 110° C. with stirring. Right after the start of the stirring, a reaction accompanied by generation of carbon dioxide was started. Then, the stirring was continued until the generation of carbon dioxide was completed. As a result, a suspension was obtained in which shiny blue silver nano-particles were suspended in the amine-carboxylic acid mixture.

Then, 10 g of methanol was added to the obtained suspension with stirring. Then, the silver nano-particles were spun down by centrifugation to remove a supernatant. Then, 10 g of methanol was again added to the silver nano-particles with stirring, and then the silver nano-particles were spun down by centrifugation to remove a supernatant. In this way, wet silver nano-particles were obtained.

Preparation and Calcining of Silver-Nano Ink

Then, a tetradecane/decalin/isopropylcyclohexane/1-octanol mixed solvent (weight ratio=20/40/20/20) was added to the wet silver nano-particles with stirring so that a silver concentration was 50 wt % to prepare a silver nano-particle dispersion liquid. The silver nano-particle dispersion liquid was applied onto an alkali-free glass plate by spin coating to form a coating film.

The coating film was calcined in a fan drying oven at 120° C. for 15 minutes to form a calcined silver film having a thickness of 1 μm. The specific resistance value of the obtained calcined silver film was measured by a four-terminal method, and as a result, the calcined silver film exhibited excellent conductivity of 11.8 μΩcm.

Further, the silver nano-particle dispersion liquid was used for ink-jet printing (ink-jet head KM-512MH manufactured by KONICA MINOLTA, INC.) and, as a result, was well jetted out.

Evaluation of Dispersibility

The dispersibility of the above described silver nano-particle dispersion liquid was evaluated in the following manner.

The above prepared silver nano-particle dispersion liquid was filtered through a 0.2-μm filter. As a result, clogging of the filter did not occur. That is, the silver nano-particle dispersion liquid was kept in a state where the silver nano-particles were well dispersed.

Evaluation of Volatilization Suppressibility

After the completion of the filtration through a filter, the volatilization suppressibility of the silver nano-particle dispersion liquid was evaluated in the following manner.

One droplet of the prepared silver nano-particle dispersion liquid was dropped with a dropper onto an alkali-free glass plate at 25° C., and the time that elapsed before the droplet on the glass plate was dried was measured. The completion of drying was determined by visual observation and touch. That is, the completion of drying was determined by visually observing the disappearance of a liquid and by touching the glass plate to make sure that no liquid was attached to a finger.

In such a test, the silver nano-particle dispersion liquid obtained in Example 1 was not dried even after a lapse of 5 minutes, that is, exhibited sufficiently high volatilization suppressibility.

Regarding Silver Oxalate-Amine Complex

The viscous white substance obtained in the process of preparing silver nano-particles was analyzed by a DSC (Differential Scanning calorimeter), and as a result, its average exothermic onset temperature by thermal decomposition was 102.5° C. On the other hand, silver oxalate as a starting material was also analyzed by a DSC similarly, and as a result, its average exothermic onset temperature by thermal decomposition was 218° C. That is, the viscous white substance obtained in the process of preparing silver nano-particles had a lower thermal decomposition temperature than silver oxalate as a starting material. The results indicate that the viscous white substance obtained in the process of preparing silver nano-particles was a material obtained by bonding between silver oxalate and the alkylamine, and the white substance was estimated to be a silver oxalate-amine complex in which the amino group of the alkylamine was coordinated to a silver atom in silver oxalate.

The DSC analysis was performed under the following conditions:

Device: DSC 6220-ASD2 (manufactured by SII Nanotechnology Inc.);
Sample container: 15-μL gold-plated sealed cell (manufactured by SII Nanotechnology Inc.);
Temperature rise rate: 10° C./min (room temperature to 600° C.);
Atmosphere gas inside the cell: air filled at atmospheric pressure; and
Atmosphere gas outside the cell: nitrogen stream (50 mL/min).

In addition, the IR spectrum of the viscous white substance obtained in the process of preparing silver nano-particles was measured, and as a result, absorption derived from the alkyl group of the alkylamine was observed (at about 2,900 cm$^{-1}$ and about 1,000 cm$^{-1}$). The result also indicates that the viscous white substance obtained in the process of preparing silver nano-particles was a material obtained by bonding between silver oxalate and the alkylamine, and the white substance was estimated to be a silver oxalate-amine complex in which an amino group was coordinated to a silver atom in silver oxalate.

Example 2

A silver nano-particle dispersion liquid was prepared in the same manner as in Example 1 except that the mixed solvent in preparation of silver nano-ink was changed to a cyclododecene/1-butanol mixed solvent (weight ratio=80/20). Then, a coating film was formed and calcined in the same manner as in Example 1.

The specific resistance value of the obtained calcined silver film was measured, and as a result, the calcined silver film exhibited excellent conductivity.

The prepared silver nano-particle dispersion liquid was filtered through a 0.2-μm filter. As a result, clogging of the filter did not occur. That is, the silver nano-particle dispersion liquid was kept in a state where the silver nano-particles were well dispersed. Further, after the completion of the filtration through a filter, the volatilization suppressibility of the silver nano-particle dispersion liquid was evaluated. As a result, the silver nano-particle dispersion liquid was dried after a lapse of 3 minutes, that is, exhibited moderate volatilization suppressibility.

Example 3

A silver nano-particle dispersion liquid was prepared in the same manner as in Example 1 except that the mixed solvent in preparation of silver nano-ink was changed to a cyclododecene/1-decanol mixed solvent (weight ratio=80/20). Then, a coating film was formed and calcined in the same manner as in Example 1.

The specific resistance value of the obtained calcined silver film was measured, and as a result, the calcined silver film exhibited excellent conductivity.

The prepared silver nano-particle dispersion liquid was filtered through a 0.2-μm filter. As a result, clogging of the filter did not occur. That is, the silver nano-particle dispersion liquid was kept in a state where the silver nano-particles were well dispersed. Further, after the completion of the filtration through a filter, the volatilization suppressibility of the silver nano-particle dispersion liquid was evaluated. As a result, the silver nano-particle dispersion liquid was not dried even after a lapse of 5 minutes, that is, exhibited sufficiently high volatilization suppressibility.

Example 4

A silver nano-particle dispersion liquid was prepared in the same manner as in Example 1 except that the mixed solvent in preparation of silver nano-ink was changed to a decalin/1-decanol mixed solvent (weight ratio=80/20). Then, a coating film was formed and calcined in the same manner as in Example 1.

The specific resistance value of the obtained calcined silver film was measured, and as a result, the calcined silver film exhibited excellent conductivity.

The prepared silver nano-particle dispersion liquid was filtered through a 0.2-μm filter. As a result, clogging of the filter did not occur. That is, the silver nano-particle dispersion liquid was kept in a state where the silver nano-particles were well dispersed. Further, after the completion of the filtration through a filter, the volatilization suppressibility of the silver nano-particle dispersion liquid was evaluated. As a result, the silver nano-particle dispersion liquid was not dried even after a lapse of 5 minutes, that is, exhibited sufficiently high volatilization suppressibility.

Example 5

A silver nano-particle dispersion liquid was prepared in the same manner as in Example 1 except that the mixed solvent in preparation of silver nano-ink was changed to a tetradecane/decalin/1-decanol mixed solvent (weight ratio=40/40/20). Then, a coating film was formed and calcined in the same manner as in Example 1.

The specific resistance value of the obtained calcined silver film was measured, and as a result, the calcined silver film exhibited excellent conductivity.

The prepared silver nano-particle dispersion liquid was filtered through a 0.2-μm filter. As a result, clogging of the filter did not occur. That is, the silver nano-particle dispersion liquid was kept in a state where the silver nano-particles were well dispersed. Further, after the completion of the filtration through a filter, the volatilization suppressibility of the silver nano-particle dispersion liquid was evaluated. As a result, the silver nano-particle dispersion liquid was not dried even after a lapse of 5 minutes, that is, exhibited sufficiently high volatilization suppressibility.

Example 6

A silver nano-particle dispersion liquid was prepared in the same manner as in Example 1 except that the mixed solvent in preparation of silver nano-ink was changed to a tetradecane/decalin/ethylcyclohexane/1-octanol mixed solvent (weight ratio=20/40/20/20). Then, a coating film was formed and calcined in the same manner as in Example 1.

The specific resistance value of the obtained calcined silver film was measured, and as a result, the calcined silver film exhibited excellent conductivity.

The prepared silver nano-particle dispersion liquid was filtered through a 0.2-μm filter. As a result, clogging of the filter did not occur. That is, the silver nano-particle dispersion liquid was kept in a state where the silver nano-particles were well dispersed. Further, after the completion of the filtration through a filter, the volatilization suppressibility of the silver nano-particle dispersion liquid was evaluated. As a result, the silver nano-particle dispersion liquid was not dried even after a lapse of 5 minutes, that is, exhibited sufficiently high volatilization suppressibility.

Example 7

A silver nano-particle dispersion liquid was prepared in the same manner as in Example 1 except that the mixed solvent in preparation of silver nano-ink was changed to a tetradecane/decalin/isopropylcyclohexane/1-butanol mixed solvent (weight ratio=20/40/20/20). Then, a coating film was formed and calcined in the same manner as in Example 1. The specific resistance value of the obtained calcined silver film was measured, and as a result, the calcined silver film exhibited excellent conductivity.

The prepared silver nano-particle dispersion liquid was filtered through a 0.2-μm filter. As a result, clogging of the filter did not occur. That is, the silver nano-particle dispersion liquid was kept in a state where the silver nano-particles were well dispersed. Further, after the completion of the filtration through a filter, the volatilization suppressibility of the silver nano-particle dispersion liquid was evaluated. As a result, the silver nano-particle dispersion liquid was dried after a lapse of 3 minutes, that is, exhibited moderate volatilization suppressibility.

Example 8

A silver nano-particle dispersion liquid was prepared in the same manner as in Example 1 except that the mixed solvent in preparation of silver nano-ink was changed to a tetradecane/decalin/n-butylcyclohexane/1-octanol mixed solvent (weight ratio=20/40/20/20). Then, a coating film was formed and calcined in the same manner as in Example 1. The specific resistance value of the obtained calcined silver film was measured, and as a result, the calcined silver film exhibited excellent conductivity.

The prepared silver nano-particle dispersion liquid was filtered through a 0.2-μm filter. As a result, clogging of the filter did not occur. That is, the silver nano-particle dispersion liquid was kept in a state where the silver nano-particles were well dispersed. Further, after the completion of the filtration through a filter, the volatilization suppressibility of the silver nano-particle dispersion liquid was evaluated. As a result, the silver nano-particle dispersion liquid was not dried even after a lapse of 5 minutes, that is, exhibited sufficiently high volatilization suppressibility.

Example 9

A silver nano-particle dispersion liquid was prepared in the same manner as in Example 1 except that the mixed solvent in preparation of silver nano-ink was changed to a tetradecane/decalin/limonene/1-octanol mixed solvent (weight ratio=20/40/20/20). Then, a coating film was formed and calcined in the same manner as in Example 1. The specific resistance value of the obtained calcined silver film was measured, and as a result, the calcined silver film exhibited excellent conductivity.

The prepared silver nano-particle dispersion liquid was filtered through a 0.2-μm filter. As a result, clogging of the filter did not occur. That is, the silver nano-particle dispersion liquid was kept in a state where the silver nano-particles were well dispersed. Further, after the completion of the filtration through a filter, the volatilization suppressibility of the silver nano-particle dispersion liquid was evaluated. As a result, the silver nano-particle dispersion liquid was not dried even after a lapse of 5 minutes, that is, exhibited sufficiently high volatilization suppressibility.

Example 10

A silver nano-particle dispersion liquid was prepared in the same manner as in Example 1 except that the mixed solvent in preparation of silver nano-ink was changed to a tetradecane/decalin/γ-terpinene/1-octanol mixed solvent (weight ratio=20/40/20/20). Then, a coating film was formed and calcined in the same manner as in Example 1. The specific resistance value of the obtained calcined silver film was measured, and as a result, the calcined silver film exhibited excellent conductivity.

The prepared silver nano-particle dispersion liquid was filtered through a 0.2-μm filter. As a result, clogging of the filter did not occur. That is, the silver nano-particle dispersion liquid was kept in a state where the silver nano-particles were well dispersed. Further, after the completion of the filtration through a filter, the volatilization suppressibility of the silver nano-particle dispersion liquid was evaluated. As a result, the silver nano-particle dispersion liquid was not dried even after a lapse of 5 minutes, that is, exhibited sufficiently high volatilization suppressibility.

Comparative Example 1

A silver nano-particle dispersion liquid was prepared in the same manner as in Example 1 except that the mixed solvent in preparation of silver nano-ink was changed to an octane/1-butanol mixed solvent (weight ratio=80/20). Then, a coating film was formed and calcined in the same manner as in Example 1.

The specific resistance value of the obtained calcined silver film was measured, and as a result, the calcined silver film exhibited excellent conductivity.

The prepared silver nano-particle dispersion liquid was filtered through a 0.2-μm filter. As a result, clogging of the filter did not occur. That is, the silver nano-particle dispersion liquid was kept in a state where the silver nano-particles were well dispersed. After the completion of the filtration through a filter, the volatilization suppressibility of the silver nano-particle dispersion liquid was evaluated. However, the silver nano-particle dispersion liquid was dried before a lapse of 1 minute, that is, exhibited poor volatilization suppressibility.

Comparative Example 2

A silver nano-particle dispersion liquid was prepared in the same manner as in Example 1 except that the mixed solvent in preparation of silver nano-ink was changed to a tetradecane/decanol mixed solvent (weight ratio=80/20).

The prepared silver nano-particle dispersion liquid was filtered through a 0.2-μm filter, and as a result, clogging of the filter occurred. That is, it was confirmed that the silver nano-particles lost independent dispersibility in the silver nano-particle dispersion liquid.

Example 11

A silver nano-particle dispersion liquid was prepared in the same manner as in Example 1 except that the composition of the amine-carboxylic acid mixture solution in preparation of silver nano-particles was changed as follows: 1.46 g (20.0 mmol) of n-butylamine, 3.44 g (34.0 mmol) of hexylamine, 0.78 g (6.0 mmol) of octylamine, and 0.13 g (0.45 mmol) of oleic acid; and further that the mixed solvent in preparation of silver nano-ink was changed to a tetradecane/decalin/1-decanol mixed solvent (weight ratio=40/40/20). Then, a coating film was formed and calcined in the same manner as in Example 1.

The specific resistance value of the obtained calcined silver film was measured, and as a result, the calcined silver film exhibited excellent conductivity.

The prepared silver nano-particle dispersion liquid was filtered through a 0.2-μm filter. As a result, clogging of the filter did not occur. That is, the silver nano-particle dispersion liquid was kept in a state where the silver nano-particles were well dispersed. Further, after the completion of the filtration through a filter, the volatilization suppressibility of the silver nano-particle dispersion liquid was evaluated. As a result, the silver nano-particle dispersion liquid was not dried even after a lapse of 5 minutes, that is, exhibited sufficiently high volatilization suppressibility.

Comparative Example 3

A silver nano-particle dispersion liquid was prepared in the same manner as in Example 11 except that the mixed solvent in preparation of silver nano-ink was changed to a tetradecane/decanol mixed solvent (weight ratio=80/20).

The prepared silver nano-particle dispersion liquid was filtered through a 0.2-μm filter. As a result, clogging of the filter occurred. That is, it was confirmed that the silver nano-particles lost independent dispersibility in the silver nano-particle dispersion liquid.

Example 12

A silver nano-particle dispersion liquid was prepared in the same manner as in Example 1 except that the composition of the amine-carboxylic acid mixture solution in preparation of silver nano-particles was changed as follows: 1.53 g (15.0 mmol) of N,N-dimethyl-1,3-propanediamine, 2.33 g (23.0 mmol) of hexylamine, 0.37 g (2.0 mmol) of dodecylamine, and 0.10 g (0.36 mmol) of oleic acid; and further that the mixed solvent in preparation of silver nano-ink was changed to a tetradecane/decalin/1-decanol mixed solvent (weight ratio=40/40/20). Then, a coating film was formed and calcined in the same manner as in Example 1.

The specific resistance value of the obtained calcined silver film was measured, and as a result, the calcined silver film exhibited excellent conductivity.

The prepared silver nano-particle dispersion liquid was filtered through a 0.2-μm filter. As a result, clogging of the filter did not occur. That is, the silver nano-particle dispersion liquid was kept in a state where the silver nano-particles were well dispersed. Further, after the completion of the filtration through a filter, the volatilization suppressibility of the silver nano-particle dispersion liquid was evaluated. As a result, the silver nano-particle dispersion liquid was not dried even after a lapse of 5 minutes, that is, exhibited sufficiently high volatilization suppressibility.

The invention claimed is:

1. A method for producing silver nanoparticle-containing ink, comprising:
   mixing a silver compound with an amine mixture comprising an aliphatic hydrocarbon monoamine (A) comprising an aliphatic hydrocarbon group and one amino group, said aliphatic hydrocarbon group having 6 or more carbon atoms in total; and further comprising at least one of: an aliphatic hydrocarbon monoamine (B) comprising an aliphatic hydrocarbon group and one amino group, said aliphatic hydrocarbon group having 5 or less carbon atoms in total; and an aliphatic hydrocarbon diamine (C) comprising an aliphatic hydrocarbon group and two amino groups, said aliphatic hydrocarbon group having 8 or less carbon atoms in total; to form a complex compound comprising the silver compound and the amines;
   thermally decomposing the complex compound by heating to form silver nano-particles; and
   dispersing the silver nano-particles in a dispersion solvent containing an alicyclic hydrocarbon.

2. The method for producing silver nanoparticle-containing ink according to claim 1, wherein the silver compound is silver oxalate.

3. The method for producing silver nanoparticle-containing ink according to claim 1, wherein the alicyclic hydrocarbon is a compound containing a six- to twelve-membered ring structure.

4. The method for producing silver nanoparticle-containing ink according to claim 1, wherein the alicyclic hydrocarbon is a compound containing a six-membered ring structure.

5. The method for producing silver nanoparticle-containing ink according to claim 1, wherein the alicyclic hydrocarbon is a compound having a monocyclic or polycyclic structure.

6. The method for producing silver nanoparticle-containing ink according to claim 1, wherein the alicyclic hydrocarbon is contained in the dispersion solvent in an amount of 10 to 90 wt %.

7. The method for producing silver nanoparticle-containing ink according to claim 1, wherein the dispersion solvent further contains an aliphatic alcohol having 4 or more carbon atoms.

8. The method for producing silver nanoparticle-containing ink according to claim 7, wherein the aliphatic alcohol having 4 or more carbon atoms is contained in the dispersion solvent in an amount of 10 to 90 wt %.

9. The method for producing silver nanoparticle-containing ink according to claim 1, wherein the aliphatic hydrocarbon monoamine (A) is an alkylmonoamine having 6 or more and 12 or less carbon atoms.

10. The method for producing silver nanoparticle-containing ink according to claim 1, wherein the aliphatic hydrocarbon monoamine (B) is an alkylmonoamine having 2 or more and 5 or less carbon atoms.

11. The method for producing silver nanoparticle-containing ink according to claim 1, wherein the aliphatic hydrocarbon diamine (C) is an alkylenediamine in which one of the two amino groups is a primary amino group, and the other is a tertiary amino group.

12. The method for producing silver nanoparticle-containing ink according to claim 1, wherein the aliphatic amines are used in an amount of 1 to 50 moles as a total of the monoamine (A), the monoamine (B) and the diamine (C) per 1 mole of silver atoms in the silver compound.

13. A silver nanoparticle-containing ink comprising silver nano-particles and a dispersion solvent, which is produced by the method according to claim 1.

14. The silver nanoparticle-containing ink according to claim 13, wherein the silver nano-particles are contained in an amount of 25 wt % or more.

* * * * *